United States Patent [19]
Davis

[11] Patent Number: 5,779,799
[45] Date of Patent: Jul. 14, 1998

[54] SUBSTRATE COATING APPARATUS

[75] Inventor: Shawn D. Davis, Meridian, Id.

[73] Assignee: Micron Technology, Inc., Boise, Id.

[21] Appl. No.: 667,738

[22] Filed: Jun. 21, 1996

[51] Int. Cl.[6] ........................................................ B05C 5/00
[52] U.S. Cl. .......................... 118/663; 118/667; 118/688;
118/695; 118/696; 118/708; 118/712; 118/641;
118/52; 118/56; 118/58; 118/64; 118/66;
118/69; 118/319; 118/320; 414/935; 414/937;
414/939; 414/217; 414/222; 414/416
[58] Field of Search ............................. 118/663, 667,
118/688, 695, 696, 707, 708, 712, 641,
52, 56, 58, 64, 66, 69, 319, 320, 728, 50;
414/935–937, 939, 217, 222, 416

[56] References Cited

U.S. PATENT DOCUMENTS

| | | |
|---|---|---|
| 4,985,722 | 1/1991 | Ushijima et al. |
| 5,177,514 | 1/1993 | Ushijima et al. |
| 5,202,716 | 4/1993 | Tateyama et al. |
| 5,339,128 | 8/1994 | Tateyama et al. |
| 5,403,397 | 4/1995 | Beckers et al. ............... 118/52 |
| 5,405,443 | 4/1995 | Akimoto et al. ............... 118/52 |
| 5,429,912 | 7/1995 | Neoh . |
| 5,510,724 | 4/1996 | Itoyama et al. ............... 414/416 |
| 5,516,732 | 5/1996 | Flegal ............................ 414/935 |
| 5,518,542 | 5/1996 | Matsukawa et al. .......... 118/52 |
| 5,536,128 | 7/1996 | Shimoyashiro et al. ...... 414/273 |
| 5,555,177 | 9/1996 | Simmons ...................... 134/902 |
| 5,565,034 | 10/1996 | Nanbu et al. .................. 118/52 |
| 5,578,127 | 11/1996 | Kimura .......................... 134/902 |

*Primary Examiner*—Laura Edwards
*Attorney, Agent, or Firm*—Kirkpatrick & Lockhart LLP

[57] ABSTRACT

An apparatus is provided for coating a surface of a plate-like material, or substrate, specifically a semiconductor wafer, with a coating material. The apparatus includes a plurality of self-controlled removable modules including a coating assembly, at least one thermal conditioning module, and a substrate handling device, and a host controller. The coating assembly is used to dispense coating material from a coating source onto the surface of the substrate material positioned in the coating assembly. The material handling device is positioned to access and move substrates between the coating assembly, the at least one thermal conditioning module and other modules included in the apparatus. The host controller provides substrate thermal conditioning, coating and handling information to the corresponding modules and tracks the location of each substrate in the apparatus. In a preferred embodiment, each module has an individual controller that receives and executes treatment and handling instructions from the host controller. Preferably, the coating assembly and the at least one thermal conditioning module are arranged in opposing assemblies that define a middle portion therebetween in which the handling device is positioned. The opposing assemblies having outwardly opposing front and back faces which allows full access to the modules, from one or the other faces, and facilitates side-by-side arrangement of the apparatuses in a clean room.

18 Claims, 6 Drawing Sheets

SUBSTRATE COATING APPARATUS

BACKGROUND OF THE INVENTION

1. Field of the Invention

The present invention relates to an improved spin system layout and control apparatus and methods for dispensing a process liquid onto a surface. More particularly, the present invention relates to improved spin coating system for the placement of photoresist and developer on a semiconductor substrate wafer.

2. Description of the Invention Background

Integrated circuits are typically constructed by depositing a series of individual layers of predetermined materials on a wafer shaped semiconductor substrate, or "wafer". The individual layers of the integrated circuit are in turn produced by a series of manufacturing steps. For example, in forming an individual circuit layer on a wafer containing a previously formed circuit layer, an oxide, such as silicon dioxide, is deposited over the previously formed circuit layer to provide an insulating layer for the circuit. A pattern for the next circuit layer is then formed on the wafer using a radiation alterable material, known as photoresist. Photoresist materials are generally composed of a mixture of organic resins, sensitizers and solvents. Sensitizers are compounds, such as diazonapthaquinones, that undergo a chemical change upon exposure to radiant energy, such as visible and ultraviolet light resulting in an irradiated material having differing salvation characteristics with respect to various solvents than the nonirradiated material. Resins are used to provide mechanical strength to the photoresist and the solvents serve to lower the viscosity of the photoresist so that it can be uniformly applied to the surface of the wafers. After a photoresist layer is applied to the wafer surface, the solvents are evaporated and the photoresist layer is hardened, usually by heat treating the wafer. The photoresist layer is then selectively irradiated by placing a radiation opaque mask containing a transparent portion defining the pattern for the next circuit layer over the photoresist layer and then exposing the photoresist layer to radiation. The photoresist layer is then exposed to a chemical, known as developer, in which either the irradiated or the nonirradiated photoresist is soluble and the photoresist is removed in the pattern defined by the mask, selectively exposing portions of the underlying insulating layer. The exposed portions of the insulating layer are then selectively removed using an etchant to expose corresponding sections of the underlying circuit layer. The photoresist must be resistant to the etchant, so as to limit the attack of the etchant to only the exposed portions of the insulating layer. Alternatively, the exposed underlying layer(s) may be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

The handling and treatment of the wafers must take place in a clean room environment in order to prevent contamination of the layers. As a result, a significant portion of the cost involved with the photoresist processing stages are associated with the cost of maintaining the clean room. Therefore, a reduction in the overall production cost of the integrated circuit can be realized by reducing the amount of space, or "footprint", occupied by the equipment in the clean room. In addition, because all clean room activities must be shut down and an extensive cleanliness procedure followed after the performance of maintenance, further cost saving can be realized by minimizing the amount of maintenance time spent in the clean room.

Efforts in the prior art to date have focussed on minimizing floor space and increasing production capacity by integrating the resist processing system and automating the handling and treatment of the wafers using a centralized controller. One such system is disclosed in U.S. Pat. No. 4,985,722 issued to Ushijima et al. and related U.S. Pat. Nos. 5,177,514, 5,202,716 and 5,339,128. A problem that arises with the prior art integrated spin coating systems is that when the heating or cooling assemblies must be repaired or replaced, extensive and costly amounts of downtime occur because of the integration of the system. The costs are especially significant in a clean room environment in which all operations in the clean room have to be shut down until cleanliness can again be achieved at a cost of thousands of dollars an hour. Another problem that exists in the prior art is the amount of movement necessary by the wafer handling device which will tend to generate particulate contamination. In addition, because a path must be available for the movement of the wafer handler, this space is unavailable for other use and also will be unproductive during the portion of the process, in which the handling device is not located therein.

As such, the present invention is directed to modular process liquid dispense systems and methods using the same which overcome, among others, the above-discussed problems so as to provide a more easily controlled and maintained coating system having a smaller footprint for use in resist processing of semiconductor wafers.

SUMMARY OF THE INVENTION

The above objects and others are accomplished by apparatuses and methods in accordance with the present invention. The apparatus includes at least one self-controlled treatment module, at least one treatment module being a coating assembly capable of dispensing a coating material from a coating source onto the surface of the plate-like material positioned in said coating assembly, at least one plate-like material handling device positioned to access the plate-like material, and to move the material between the treatment modules and position the material in the treatment modules, and a host controller connected to the treatment modules and the handling device. The host controller controls the handling device to provide for movement of the material relative to each treatment module, and controls the treatment module to perform a treatment on the material and tracks the plate-like material in the apparatus. A preferred embodiment includes a plurality of treatment modules and one handling device, each of which are self-controlled and receive treatment and handling instructions from the host controller and the individual treatment and handling controllers control the treatment and handling of the plate-like material. In this way, the apparatus is thus highly modular and the individual complexities of the treatment and handling systems are concentrated in application specific controllers which can be readily monitored and which greatly simplifies the wiring and control systems needed in the apparatus.

Preferably, the treatment modules are arranged in two opposing assemblies that define a middle portion therebetween in which the handling device is positioned. The opposing assemblies have outwardly opposing faces to provide access to all of the treatment modules from either of the faces, which allows for the apparatuses to be arranged in a side-by-side manner in the clean room so as to minimize the amount of floor space required. In addition, the coating assembly and plate-like material loading platforms are provided in a first opposing assembly and all other treatment modules are provided in a second opposing assembly. This arrangement allows a significant portion of the second opposing assembly to be located outside of the clean room environment and also eliminates the need to occupy floor space to perform material loading operations, both of which further reduce the clean room space required to operate the machines.

Accordingly, the present invention provides for a highly modular system that minimizes the downtime required for maintenance and the amount of clean room space occupied by the apparatus. In addition, the system layout provides for optimal utilization of the system components without increasing the floor space of the apparatus. These advantages and others will become apparent from the following detailed description of the present invention.

BRIEF DESCRIPTION OF THE DRAWINGS

The preferred embodiment of the present invention will be described in greater detail with reference to the accompanying drawings, wherein like members bear like reference numerals and wherein.

DETAILED DESCRIPTION OF PREFERRED EMBODIMENTS

Figure 1:
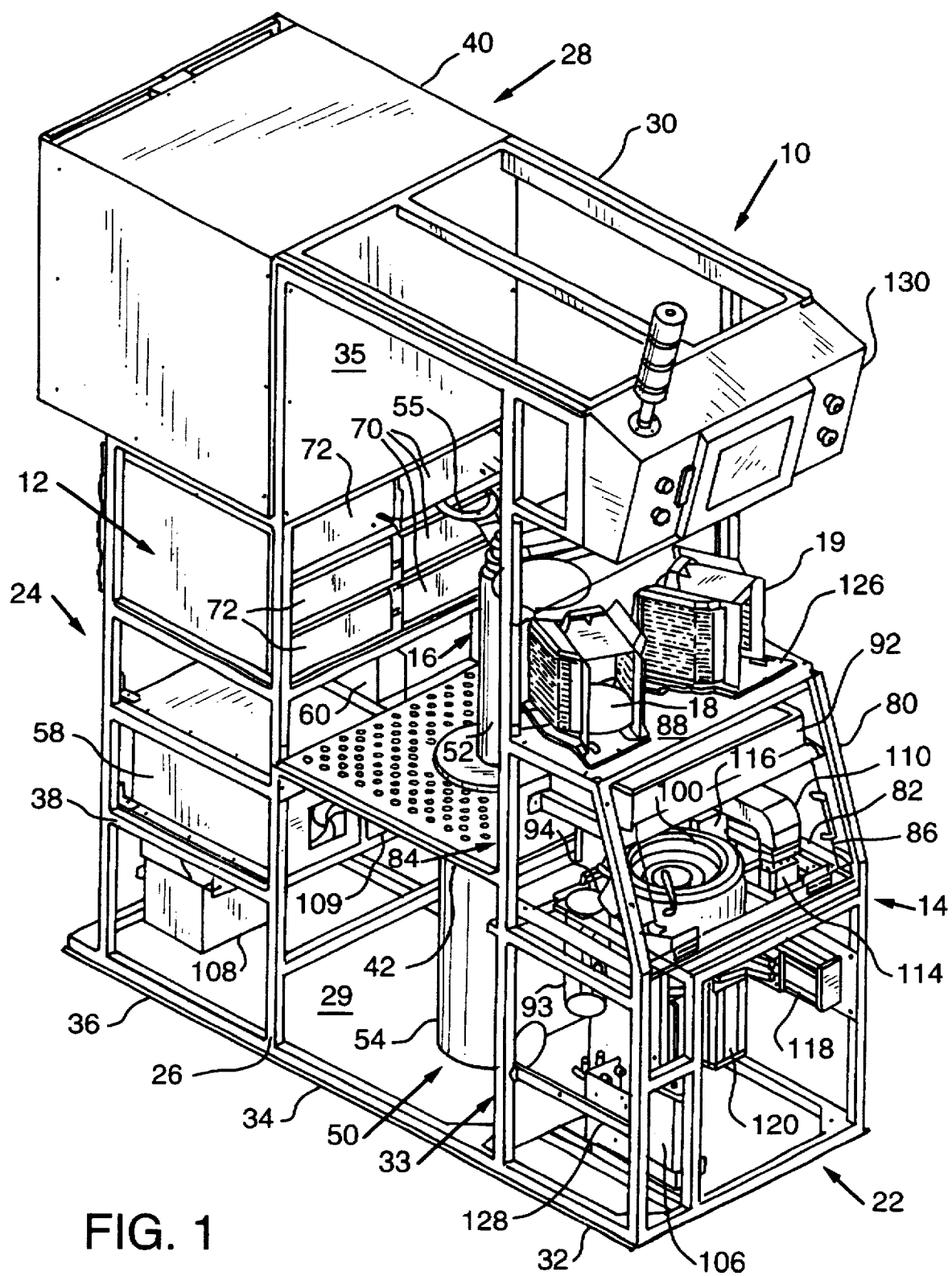
FIG. 1 is a perspective view of the present invention with a number of enclosure panels removed.
Figure 2:
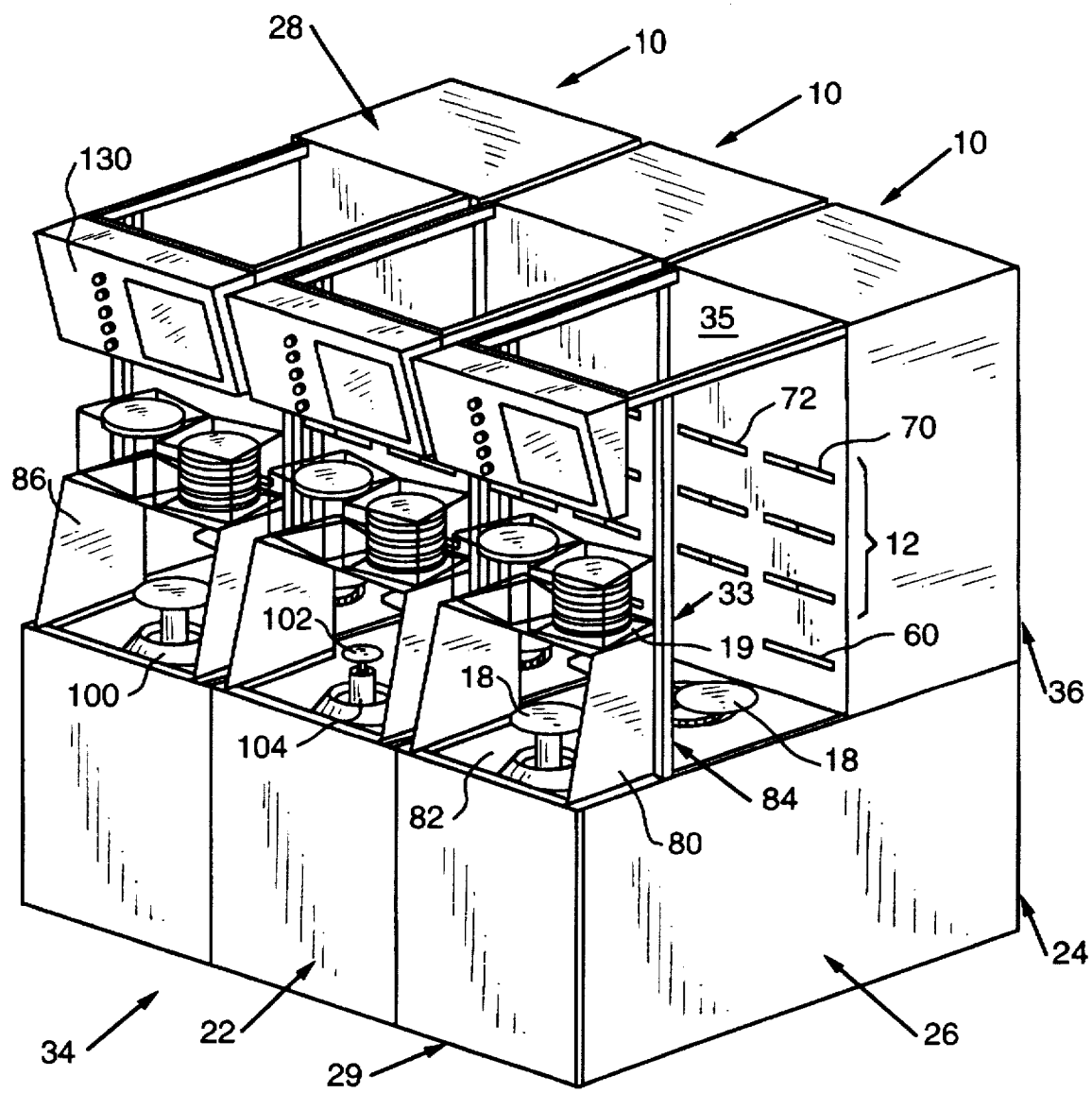
FIG. 2 is a perspective view of a possible arrangement of a number of apparatuses according to the present invention.
Figure 3:
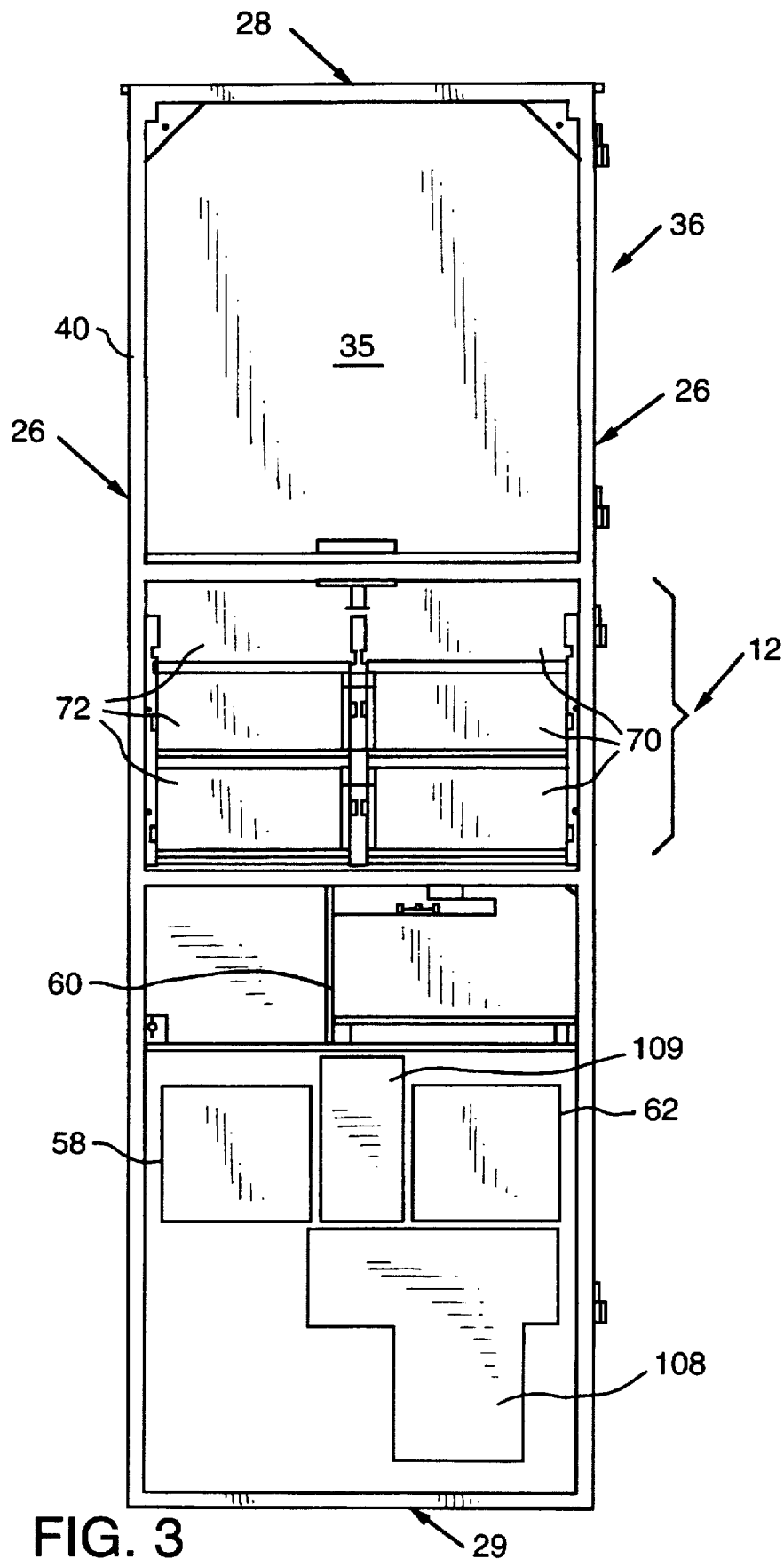
FIG. 3 is a front view of the back portion from the middle portion.
Figure 4:
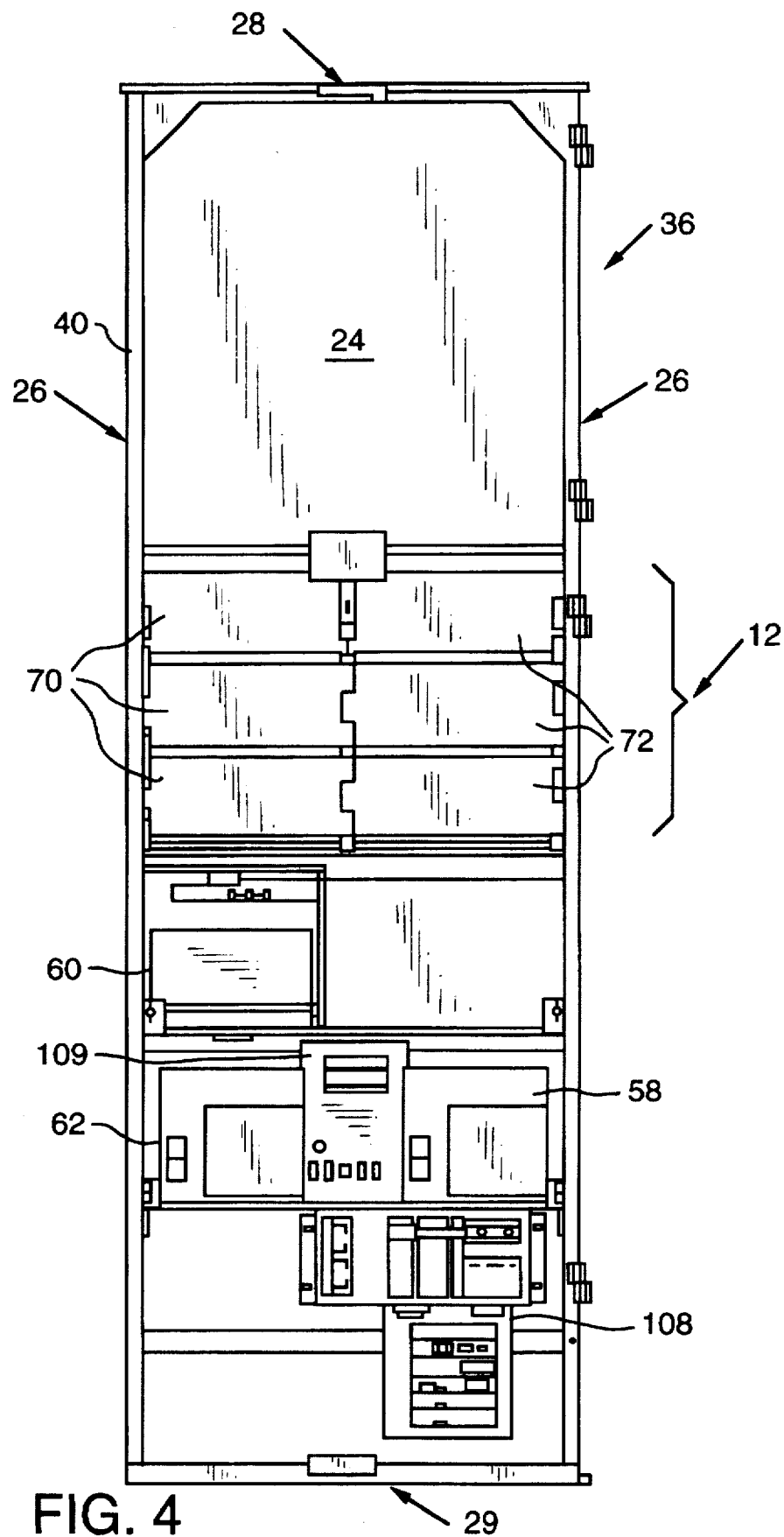
FIG. 4 is a rear view of the back portion looking from the plenum.

The operation of the apparatus 10 and methods will be described generally with reference to the drawings for the purpose of illustrating present preferred embodiments of the invention only and not for purposes of limiting the same. The apparatus 10 of the present invention is useful for coating a surface of a plate-like material and includes a plurality of treatment modules including thermal conditioning modules 12, a spin coating, or dispense, assembly 14, and a robotic wafer handling assembly 16 for retrieving wafers 18 from a cassette 19 and delivering the wafers 18 to various components according to handling instructions provided by a host controller 20. While the preferred embodiments will be described for convenience generally with respect to use of the apparatus 10 to apply photoresist to a wafer 18, persons skilled in the art will appreciate that the present invention is equally well suited for use developing a photoresist coating on a wafer, and more generally to applying any type of process liquid to a plate-like material.

Figure 6:
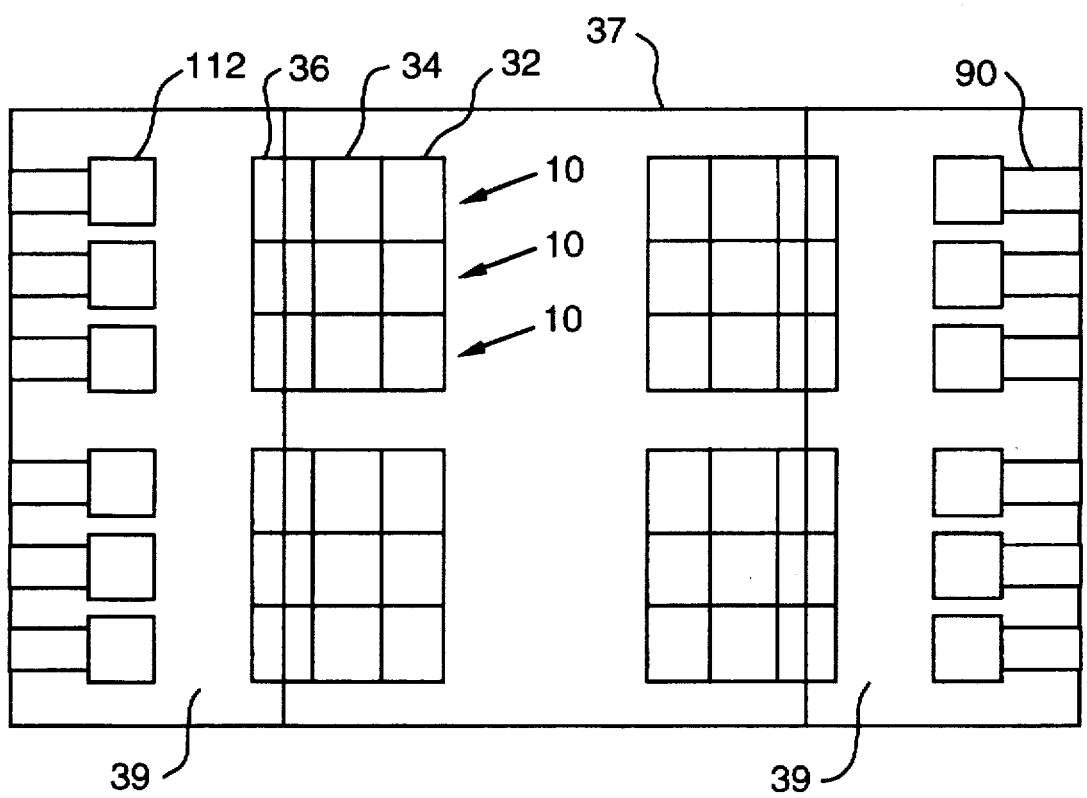

The apparatus 10 is generally rectangularly shaped having a front 22, a back 24, sides 26, a top 28 and a bottom 29. In a preferred embodiment, a frame 30 is provided having a front portion 32, a middle portion 34 and a back portion 36. The frame 30 is sized to support the thermal conditioning modules 12, the spin coating assembly 14 and the robotic wafer handling assembly 16. The front and back portions, 32 and 36, respectively, are two directly opposing assemblies having directly opposing faces, 33 and 35, respectively, through which the plate-like material is placed into the treatment modules. The front portion 32, or first assembly, contains the spin coating assembly 14. The back portion 36, or second assembly, contains the remaining treatment modules including the thermal conditioning modules 12. The back portion 36 also contains a plurality of horizontal shelves 38 conditioning modules 12 from the back 24 of the apparatus 10 and an electronics cabinet 40 containing the host controller 20 is loaded above the shelves 38. The middle portion 34 includes a horizontal robot support shelf 42 disposed around the wafer handling assembly 16 between the sides 26 and the front and back portion, 32 and 36, respectively, of the frame 30. Preferably, all equipment and electronics not directly associated with treating the wafers 18 are positioned in the back portion 36 of the frame 30 so as to segregate the components of the apparatus and optimize the amount of equipment and electronics necessary in a clean room 37. In this configuration, all of the treatment modules can be fully accessed from the outwardly opposing front and back faces 22 and 24 and from one of the opposing faces 33 and 35 defining the middle portion 34. This allows the apparatuses to be placed in a side-by-side arrangement with the back portion 36 extending outside of the clean room 37 into an external plenum region 39 as shown in FIG. 6, thereby providing maintenance access to the electronics from outside the clean room.

In addition, the top 28 of the apparatus 10 is substantially open to provide access to remove the robotic wafer handling assembly 16 without having to disturb the side-by-side arrangement of the apparatuses. The lifting of the robotic wafer handling assembly 16 can be performed using a portable counterbalanced crane assembly having a crane arm that can be extended beyond the base of the crane to lift the assembly or by any conventional method. The bottom 29 of the apparatus 10 preferably has a raised portion such that lift bars can be slid beneath the bottom 29 and the apparatus can be lifted and moved using the bars, such as by employing opposing portable wheeled jacks at each end of the lifting bars or by conventional methods.

In a preferred embodiment, the robotic wafer handling assembly 16 includes a horizontally stationary, vertically actuating robot 50 centered in the support shelf 42 having an actuating portion 52 extending above the support shelf 42 and a stationary portion 54 positioned below the support shelf 42. The actuating portion 52 includes at least one, preferably two, rotatable reciprocating end effectors, or "arms", 55 that can be reciprocated to insert and remove wafers 18 from the various components and a wafer mapping system (not shown) to scan the cassette 19 with a laser/detector to determine the presence of the wafer 18 and the precise vertical location of the wafer 18. A robot controller 58 is slidably disposed through the back 24, rests on horizontal shelves 38 below the plane of the support shelf 42 and is attached to the robot 50. In a preferred embodiment, an Equipe Technologies, Inc. (Sunnyvale, Calif.) Model No. ATM-307-2-CSX robot is used with an Equipe Technologies controller Part No. ESC-100 ATM and a model DD-50 laser/detector system manufactured by Hama Laboratories (Palo Alto, Calif.). However, any commercially available robots having the general characteristics described herein can be used in the present invention, including robotic handling assemblies 16 that do not contain a dedicated controller, but are controlled by the host controller 20.

In a preferred embodiment, the robotic wafer handling assembly 16 also includes wafer prealigner 60 that is slidably disposed through the back 24 onto the shelving 38 above the support shelf 42 and is used to center the wafer 18 before the wafer 18 is put into the spin coating assembly 14. An alignment controller 62 is attached to and controls the prealigner 60 and is connected to and receives alignment instructions from the host controller 20. The alignment controller 62 is slidably disposed through the back 24 onto the shelving 38 below the support shelf 42 in the back portion 36. A commercially available wafer prealigner 60, such as an Equipe Technologies PRE-201, and alignment controllers 62, such as Equipe Technologies ESC-101, can be used with the present invention. Alternatively, the prealigner 60 can be directly controlled from the host controller 20 or the robot controller 58 can be used to control the prealigner 60, in addition to the robot 50.

In a preferred embodiment, six thermal conditioning modules 12 including three heating, or bake, modules 70 and three cooling, or chill, modules 72, are slidably disposed through the back 24 on shelves 38 divided into three rows and two columns above the support shelf 42. The bake modules are used to preheat the wafer in order to drive off water vapor from the surface before spin coating photoresist material onto the surface of the wafer and also to bake the wafer following the application of the photoresist in order to harden, or cure, the photoresist coating. The chill modules 72 are used to cool the wafer 18 to process temperature following preheating and to lower the temperature of the wafer following the baking process. The total number of thermal conditioning modules 12, as well as the arrangement in terms of rows and columns, can be optimized by the practitioner depending upon the processing speed of the spin coating assembly 14 and the capabilities of the robotic assembly assembly 16. The thermal conditioning modules 12 are preferably self-contained heating and cooling modules, 70 and 72, respectively, that contain individual controllers and can an act as stand alone units, if necessary, as described in the U.S. patent application Ser. No. 08/667,704 entitled "Self-Contained Thermal Conditioning Apparatus", which is incorporated herein by reference. While it is preferred that a self-contained thermal conditioning module is used, other commercially available thermal conditioning modules can be used including thermal conditioning modules 12 that must be controlled by the host controller.

The spin dispense assembly 14 is positioned in the front portion 32 of the frame 30 in a spin station process enclosure 80 defined by frame 30. The enclosure includes a support table 82 on which various components of the spin dispense assembly 14 are seated, a back 84 through which the wafers 18 are loaded using the wafer handling assembly 16, a front door 86 that provides an operator with access to the enclosure 80 and a top 88. The enclosure 80 is a semi-isolated environment in that access is limited to a portion of the back 84 through which the wafers 18 are placed into the spin assembly 14. An environmental control unit 90 that is external to the apparatus 10 and outside the clean room environment is used to control the air temperature and humidity level within the enclosure to specified process conditions and to provide a continuous air flow through the enclosure 80. The process air is plumbed through the back 24 of the apparatus 10 into the enclosure 80 through an air filter 92, such as an ULPA filter manufactured by Filtra Corporation (Hawthorne, N.J.) Part No. 5020493103/4X21, and circulated through the enclosure 80. A humidity sensor 94, such as General Precision Inc. (Valencia, Calif.) Part Nos. 90109, 90110, 90125, is also included to monitor and provide feedback control over the conditions of the process air within the enclosure 80.

The spin assembly 14 includes a process bowl 100 seated on the table 82 and attached to a drain system (not shown) which extends through the support table 82 and is plumbed out through the back 24 or bottom 29 of the apparatus 10. A rotatable spindle chuck 102 is disposed within the bowl 100 and is connected by a shaft (not shown) to and rotated by a spindle 104 that is vertically actuated using a spindle lift axis actuator 106 through an opening in the bowl 100 and the support table 82. Commercially available bowl, chuck and drain arrangements can be used with the present invention; however it is preferred that bowl and chuck arrangement be used such as that described in the U.S. patent application Ser. No. 08/667,784 entitled "Improved Spin Coating Process Bowl", which is incorporated herein by reference.

The spindle 104 is used to spin the chuck 102 at predetermined speed using a servo design motor to ramp up to speed and a phase-locked loop control to maintain the revolutions per minute (RPM) to within a prescribed range. The spindle 104 contains water cooling lines to remove heat generated by the motor and the bearing and to control the temperature of the spindle 104. The spindle 104 has a dedicated spindle controller 108 that is slidably disposed through the back 24 and positioned in the back portion 36 and connected to the spindle 104 and host controller 20. Commercially available spindles 104 and spindle controllers 108, such as MFM Technologies Inc. (Ronkonkoma, N.Y.) Part Nos. BDC4000X-2678 and 18390, can be used in the present invention. The actuator 106 is positioned in the front portion 32 of the frame 30 beneath enclosure 80 and is preferably a serve controlled linear slide having programmable position control to provide precise control over the movement of the chuck 102. For example, an IAI America Inc. (Torrence, Calif.) Part No. 25-M-2-S-10-100-2 can be used in the present invention in conjunction with an actuator controller 109, such as an Intelligent actuator manufactured by IAI America, which is positioned on shelves 38 on the back portion 36 below table 42 and connected to the host controller 20.

The spin assembly 14 further includes a dispense arm 110 that is movably positioned on the support table 82 to dispense appropriate chemicals onto the wafer 18 positioned on the chuck 102. The dispense arm 110 is plumbed out the back 24 of the apparatus 10 to a chemical supply source 112 outside of the clean room which contains the chemicals for use in the spin coating process. The chemicals are dispensed onto the wafer 18 from dispense nozzles contained in the dispense arm 110 and the dispense nozzle are stored in a solvent bath 114 between spin coating processes to prevent the chemicals from drying out in the nozzles. Three dimensional movement of the dispense arm 110 is preferred to facilitate the proper positioning of the dispense arm 110 to dispense the various chemicals and can be accomplished using commercially available actuating mechanisms for "theta" axis drive 116, "Y" axis drive 118, and "Z" axis drive 120, such as from IAI America Inc. Model Nos. 12RS-80-360050-TS, IS-S-Y-M-8-60-300 and IS-S-X-M-80-60-100, respectively. The movement of the dispense arm 110 is also controlled by actuator controller 109. Preferably, the dispense arm 110 provides for temperature control of coating material, such as is described in the U.S. patent application Ser. No. 08/667,784 entitled "Spin Coating Dispense Arm Assembly", which is incorporated herein by reference. However, other dispense arms can be used in the present invention, such as are disclosed in U.S. Pat. No. 5,429,912 issued to Biche et al. or commercially available dispense arm assemblies.

A spin station controller 122 is provided to oversee the entire spin coating operation and is located in the electronics cabinet 40. Commercially available controllers can be used as the spin station controller 122, such as a Model 4025A 486 Single Board Computer from Octagon Systems Corp. (Westminster, Conn.). The spin station controller 122 interfaces with the spindle controller 108, the actuator controller 109, the environmental system 90, and the chemical supply source 112 and the host controller 20 to coordinate the sequencing and timing of the spin coating operation.

In a preferred embodiment, two cassette loading platforms 126 are positioned on the top 88 of the process enclosure 80 in the front portion 32 of the frame 30. The platforms 126 are oriented such that when the cassette 19 containing wafers 18 is placed on the platform 126, the wafers 18 can be removed by the robot arm 55. Preferably, a cassette sensor 128 is used to detect the presence of the cassette 19 and to provide a signal to the host controller 20 indicating the presence or absence of the cassette 19. While a current preferred embodiment incorporates two loading platforms 126, the preference is necessarily dictated by the selection of components to be used in any given embodiment of the apparatus 10. For example, additional platforms could be provided above the two platforms, requiring only that the robot assembly 16 be capable of reciprocating to a level where the wafers 18 can be removed from the cassette 19. The additional capacity described does not require that the footprint of the apparatus 10 be increased, because the footprint is governed only by the desired capacity of the processing equipment used in the apparatus 10 and not the wafer load/unload requirements as in the prior art.

Figure 5:
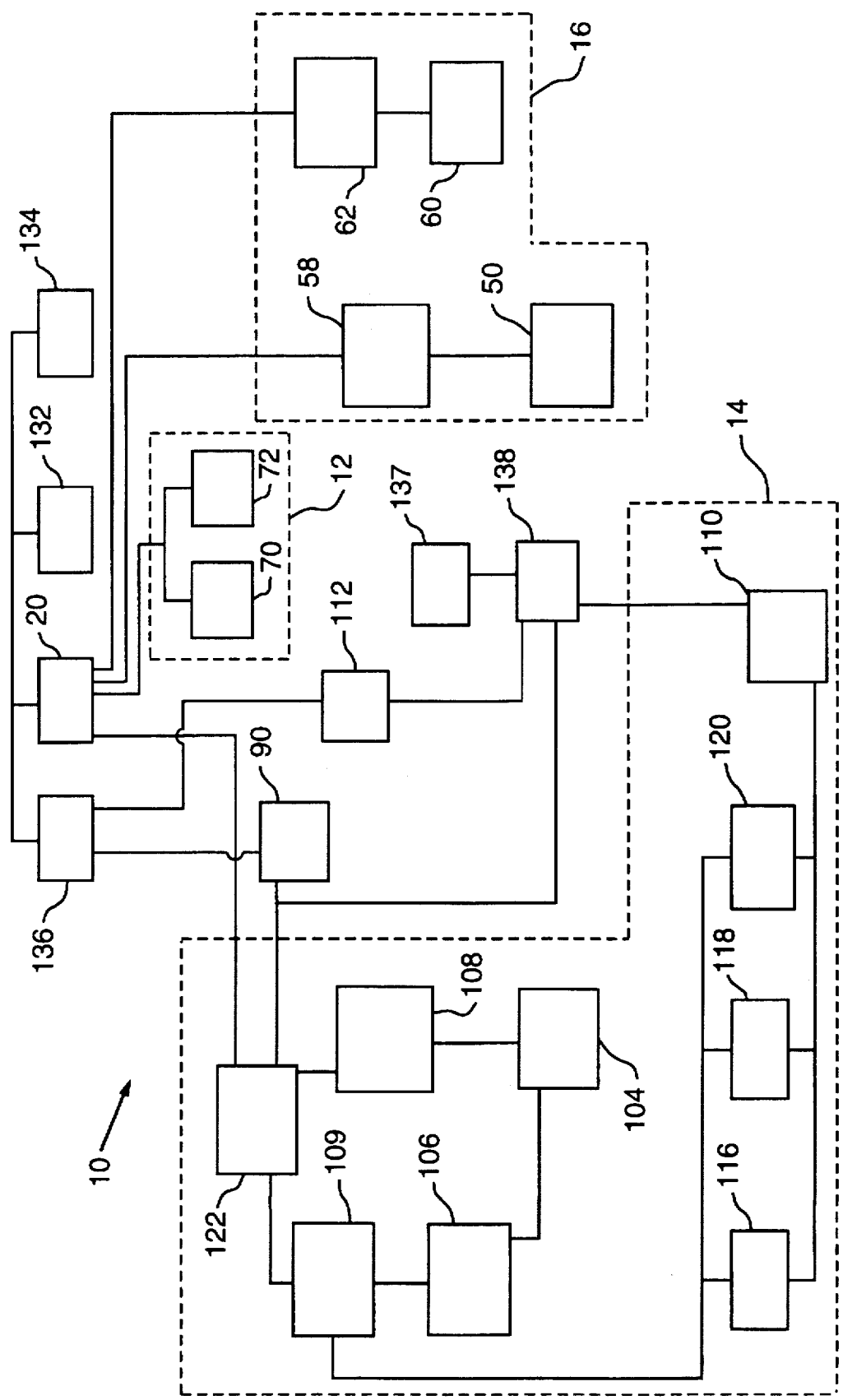
FIG. 5 is a network diagram showing a preferred embodiment of the present invention; and, FIG. 6 is a top plan view of a possible layout of the present invention in a clean room.

The host controller 20 is contained in the electronics cabinet 40 and provides high level control over all of the individual controllers in the apparatus 10 and also over the chemical dispense and the environmental control systems as shown in the network diagram of FIG. 5. In a current preferred embodiment, the host controller 20 is a Pentium P90 industrial personal computer manufactured by Industrial Computer Source (San Diego, Calif.); however, the choice of host controller 20 will clearly depend on the particular application and the state of the processor art at the time. Operator control and monitoring of the apparatus 10 and host controller 20 is provided on the front 22 of the apparatus 10 to allow the operator to manually override and interrupt control of the entire process. A conventional host input/output and display device 130 can be attached to the host controller 20 for use in the present invention. The display 130 is preferably a flatpanel touchscreen display, such as manufactured by Dolch Computer (Fremont, Calif.). It is also preferred that a similar host input/output display device be remotely attachable to the back 24 (not shown) of the apparatus 10 to allow the operator to monitor the apparatus 10 from outside the clean room.

The host controller 20 is also preferably connected to a network including user access locations 132, which provides oversight and control access to production personnel, a database or recipe server 134, and a support equipment management server 136 that controls the environmental control system 90 and the chemical supply source 112, in addition to coating material temperature controllers and pumps 137 and 138, respectively. Because there is no need for this equipment to be in the clean room, all of the above operations are controlled and performed externally to the clean room and the process chemicals and system air are plumbed to the apparatus 10. Alternatively, the information contained in the recipe server 134 can be stored in memory attached to the host controller 20.

Preferably, the wafers 18 in the cassette 19 are identified using a bar code. The bar codes are scanned, or read, by a bar code reader (not shown), such as a Symbol Technologies Inc. (Bohemia, N.Y.) Model LS-3000-1000A, and the scanned information is passed to the host controller 20, which accesses the processing instructions, or "recipe", for those particular wafers 18 from the system database 134. The processing instructions provide the details of the particular process to be performed on the wafers 18 in terms of a specific sequence of handling instructions and treatment instructions to be sent to the handling device and treatment modules by the host controller 20. For example, in photoresist applications, such treatment information includes the coating materials to be applied, the solvents to be used, the temperature, amounts and dispense rates of the coating materials and solvents, the heating and cooling temperatures and rates for the wafers, the wafer spin rates and times, the system temperature and exhaust air flow, etc.

In the operation of the present invention, the operator loads the cassette 19 containing wafers 18 to be processed onto the cassette platform 126. The cassette sensor 128 detects the presence of the cassette 19 and provides a signal to the host controller 20 indicating the presence of the cassette 19. The operator scans the bar code associated with the wafers using the bar code reader and the scanned code is transmitted to the host controller 20. The host controller 20 queries the system database 132 using the code to obtain the processing instructions for the wafers 18 corresponding to the code.

After receiving the handling and treatment instructions, or recipe, the host controller 20 transmits to the support equipment manager server 136 instructions regarding 1) the chemicals to be used in the process, 2) the temperature of the chemicals, 3) the flow rate of the chemicals, and 4) the system air temperature and exhaust flow rate. The support equipment manager server 136 takes this information and distributes it to the chemical supply source 112, the fluid temperature controllers 137, the chemical pumps 138 and the environmental control system 90, respectively.

The support equipment manager server 136 monitors the status of the chemical and environmental systems for compliance with the process instructions and queues the host controller 20 when the process conditions have been attained prior to processing and if attainment of the processing conditions is lost during processing.

When the chemical and environmental systems have achieved the desired processing conditions, the host controller 20 sends a signal to the robot controller 58 to scan the cassette 19 for wafers 18. The robot controller 58 activates the robot 50 to align the laser to be radially pointing toward the center of the wafer 18 and slightly below the level of the wafer 18. The robot controller 58 activates the laser and actuates the actuating portion 52 of the robot 50 vertically past the cassette 19 to record the vertical location of the wafers 18 in the cassette. This information is compared to the vertical location of the slots in the cassette stored in the robot controller 58 to determine which slots contain wafers 18. The host controller then directs the robot controller 58 to remove the first wafer 18 from the cassette 19 and place the wafer 18 in the treatment module called for in the recipe. The robot controller 58 then directs the robot 50 to move the actuating portion 52 to the precise level provided by the mapping system and then for the robot 50 to reciprocate arm 55 to reach into the cassette 19 and remove the wafer.

Assuming the wafer is present, the host controller 20 sends handling instructions to the robot controller 58 indicating the location of the first treatment module in which the wafer is to be processed. If, for example, the first processing step is a preheating step to drive moisture from the surface of the wafer, the host controller 20 also sends thermal conditioning instructions signal to heating module 70 providing the temperature and rate and duration of heating for processing the wafer. The robot 50 is directed by the robot controller 58 to move the wafer from the cassette 19 to the heating module 70. When the wafer has been placed into the heating module 70, the robot controller 58 informs the host controller 20 and the host controller 20 directs the heating module 70 to perform the preheating operations using the operating instructions supplied by the host controller 20. Alternatively, the heating module 70 can be provided with a sensor to detect the presence of the wafer before executing the heating instructions provided by the host controller 20. While the preheating operations are taking place, the robot 50 can be directed by the host controller 20 via the robot controller 58 to perform other operations.

At the completion of the preheating step, it may be necessary to cool the wafer prior to apply the coating material In that case, the host controller 20 provides handling instructions to the robot controller 58 to remove the wafer from the location of the heating module 70 and move the wafer a location in the cooling module 72. When the cooling module 72 detects the presence of the wafer, the cooling module 72 performs the cooling operations using the thermal conditioning instructions supplied by the host controller 20.

After the wafer has been cooled to the process temperature in the cooling module 72, it is generally necessary to align the wafer prior to applying the coating material or developer to the wafer to ensure the precise placement of the wafer in the spin coating assembly 14 and the proper dispensing of the coating material onto the wafer. The host controller 20 sends handling instructions to the robot controller 58 to remove the wafer from the cooling module 72 and move the wafer into the wafer prealigner 60 and also sends alignment instructions to the alignment controller 62, which in turn controls the prealigner during the alignment of the wafer. Following the alignment, the host controller 20 signal the robot 50 to remove the wafer from the prealigner. The host controller 20 sends the instructions to the spin station controller 122 to process the wafer 18 according to the recipe supplied by the host controller 20. The spin station controller 122 then instructs the actuator controller 109 to move the spindle 104 to the wafer loading position and the actuator controller 109 prompts the spindle lift actuator 106 to lift the spindle 104. The spin station controller 122 queues the environmental control system 90 to begin drawing a vacuum through the chuck 102. The host controller 20 instructs the robot controller 58 to place the wafer 18 on the chuck 102, which, in turn, instructs the robot 50 to place the wafer 18 on the chuck 102 and the wafer 18 held in place on the chuck 102 by the vacuum. The spin station controller 122 then sends actuation instructions to the actuator controller 109 to lower the spindle 104 to the process position in the process bowl 100 which are executed using the actuator 106. The environmental control system 90 monitors the temperature and humidity conditions in the process enclosure 80 and signals the host controller 20 if the system operating conditions fall out of specification. If the operating conditions are in specification, the spin station controller 122 runs the recipe by coordinating instructions to the spindle controller 108, the actuator controller 109, environmental system 90 and input/output with the host controller 20 according to the timing and sequencing call for in the recipe.

For a typical recipe, the spin station controller 122 will instruct the spindle controller 108 to begin spinning the spindle and to move dispense arm 110 from a stored position in the solvent bath 114 to a dispense position above the wafer in the process bowl 100 and the actuator controller 122 directs the theta, Y and Z drives, 116, 118, and 120, respectively, to perform the movement. Once the dispense arm 110 is in position over the wafer, the spin station controller 122 directs the support equipment management server 136 to operate the chemical pumps and 138 to deliver a prescribed amount of coating material at a prescribed rate through the dispense arm 110 to the wafer 18. Following the dispensing of the coating material onto the wafer, the spin station controller 122 directs the actuator controller 109 to return the dispense arm 110 to the solvent bath 114 and directs the spindle controller 108 to stop the spinning of the chuck 102. After the spindle 104 is stopped, the spin station controller 122 instructs the actuator controller 109 to lift the chuck 102 to the loading position, after which the environmental control system is instructed to release the vacuum. At that point, spin station controller 122 instructs the host controller 20 that the process is completed. The host controller 20 instructs the robot controller 58 to move the robot 50 into position and remove the wafer from the chuck 102. The host controller 20 directs the robot controller 58 to move the wafer into the heating module 70 and sends the heating module 70 thermal conditioning instructions providing the temperature and heating rate and duration of the heat treatment.

Upon completion of the heating of the wafer, the host controller 20 prompts the robot controller 58 to remove the wafer from the heating module and place the wafer into the cooling module 72. The host controller 20 provides temperature and cooling rate and duration instructions, to the cooling module 72, after which the robot controller 58 is prompted to remove the wafer from the cooling module 72 and place the wafer back into the cassette 19.

The number of wafers that can be processed during a given time period by the apparatus is invariably dependent upon the duration of the processing times of the various steps called for by the specific recipe. As should be apparent from the aforementioned example, the present invention provides an apparatus that has the flexibility to allow the processing of wafers to be performed in any sequence and without limitations as to the steps that must be included. The apparatus 10 embodies a higher architectural control level that allows the present invention to employ an integrated structure of autonomous distinct components, which greatly simplifies system analysis, testing and calibration and system layout. The high level of control allows the flexibility of the system to be exploited using relatively straightforward processing algorithms or recipes. A further benefit of the modular apparatus is realized in a preferred system layout which provides access to all treatment modules from the front and back of the apparatus, thereby allowing the apparatuses to be closely packed in a clean room environment. In addition, the placement of the treatment modules, excluding the coating assembly, on one side of the apparatus allow a portion of the apparatus to be outside of the clean room, further reducing the size of the clean room, and also allowing the treatment modules to be maintained from outside the clean room, further reducing maintenance downtime. While one embodiment of the present invention has been described incorporating distinct control structures for all of the system components, the present invention can be effectively employed for use with systems in which completely distinct hierarchical control may not be necessary or desirable. In those cases, the host controller, in addition to providing high level control of those components incorporating individual controllers, would provide lower level direct control of other operations.

Those of ordinary skill in the art will appreciate that the present invention provides significant advantages over the prior art for process liquid dispense systems. In particular, the subject invention provides a more compacted apparatus for use in a clean room environment. In addition, the invention minimizes downtime for maintenance by providing stand alone component modules that can be maintained and replaced from outside the clean room and without extended shutdown for calibration. While the subject invention provides these and other advantages over other the prior art, it will be understood, however, that various changes in the details, materials and arrangements of parts which have been herein described and illustrated in order to explain the nature of the invention may be made by those skilled in the art within the principle and scope of the invention as expressed in the appended claims.

What is claimed is:

1. An apparatus for coating a substrate surface with process liquid comprising:
 a plurality of self-controlled modules comprising
  at least one thermal conditioning module and a substrate coating assembly; and,
  a substrate handling device positioned to access said coating assembly and said at least one thermal conditioning module; and,
 a host controller connected to said plurality of self-controlled modules, wherein each of said plurality of self-controlled modules is removable without disabling said other self-controlled modules or said host controller.

2. The apparatus of claim 1, wherein said handling device comprises:
 a horizontally stationary robot having at least one rotatable reciprocating end effector to access said at least one thermal conditioning module and said coating assembly; and,
 a robot controller connected between said robot and said host controller.

3. The apparatus of claim 1, wherein said plurality of removable modules further comprises a substrate aligner.

4. The apparatus of claim 3, wherein said substrate aligner includes
 an alignment controller connected to said host controller.

5. The apparatus of claim 1, wherein said coating assembly comprises:
 a process bowl having a bottom and an interior, and said bottom contains an opening;
 a rotatable spindle movable in said opening in said bottom;
 a chuck disposed in said interior of said bowl and attached to said spindle, wherein said handling device can access said chuck;
 a dispense arm positionable to dispense process liquid from a source toward said chuck; and,
 a spin station controller connected between said host controller and said chuck and said dispense arm.

6. The apparatus of claim 5, wherein said coating assembly further comprises a spindle controller connected between said spindle and said spin station controller.

7. The apparatus of claim 6, wherein said coating assembly further comprises:
 an actuator attached to move said spindle between a process position and a loading position; and,
 an actuator controller connected between said actuator and said spin station controller.

8. The apparatus of claim 7, wherein said actuator controller is further connected to said dispense arm.

9. The apparatus of claim 1, further comprising a recipe server containing substrate thermal conditioning, coating and handling information and accessible by said host controller.

10. The apparatus of claim 9, wherein said substrate information is accessed using a code provided as input to said host controller.

11. The apparatus of claim 10, further comprising a bar code scanner connected to said host controller.

12. The apparatus of claim 1, further comprising:
 a support equipment server connected between said host controller and said coating assembly; and,
 an environmental control system connected between said host controller and said coating assembly.

13. The apparatus of claim 1, further comprising a substrate loading platform included in one of said opposing assemblies and accessible by said handling device.

14. The apparatus of claim 13, wherein;
 said coating assembly and said substrate loading platform are arranged in a first assembly; and,
 said at least one thermal conditioning module is arranged in a second assembly opposing said first assembly.

15. The apparatus of claim 14, wherein:
 said opposing assemblies have outwardly opposing faces; and,
 said at least one thermal conditioning module and said coating assembly are removable from said outwardly opposing face of said second and first assemblies, respectively.

16. The apparatus of claim 1, wherein said host controller is connected provide substrate thermal conditioning coating, and handling instructions to, and receive signals indicating the completion of said instructions from; said corresponding plurality of self-controlled modules.

17. The apparatus of claim 1, wherein each of said plurality of self-controlled modules is operative as a stand alone module.

18. An apparatus for coating a substrate surface with process liquid comprising:
 a plurality of self-controlled modules comprising
  a substrate coating assembly arranged in a first assembly,
  a plurality of thermal conditioning modules arranged in a second assembly that generally opposes said first assembly, said first and second assemblies having outwardly opposing faces,
  at least one substrate aligner disposed in said second assembly, wherein said coating assembly, and said thermal conditioning modules and said substrate aligner are removable through said outwardly opposing face of said first and second assemblies, respectively, and
 a horizontally stationary substrate handling device positioned to access said self-controlled modules in said first and second assemblies and
 a substrate loading platform disposed in said first assembly; and,
 a host controller connected to said plurality of self-controlled modules, wherein each of said plurality of self-controlled modules is removable without disabling said other self-controlled modules or said host controller.

* * * * *

UNITED STATES PATENT AND TRADEMARK OFFICE
CERTIFICATE OF CORRECTION

PATENT NO.    : 5,779,799
DATED         : July 14, 1998
INVENTOR(S)   : Shawn D. Davis It is certified that error appears in the above-identified patent and that said Letters Patent is hereby corrected as shown below:

Column 5,
Line 31, after "robotic", insert -- handling --.
Line 32, delete "assembly".

Column 6,
Line 29, delete "serve" and replace with -- servo --.

Column 7,
Line 4, delete "Conn." and replace therewith -- Co. --.

Signed and Sealed this

Seventeenth Day of December, 2002

JAMES E. ROGAN
*Director of the United States Patent and Trademark Office*